(12) United States Patent
Strader et al.

(10) Patent No.: US 8,647,752 B2
(45) Date of Patent: Feb. 11, 2014

(54) THERMAL INTERFACE MATERIAL ASSEMBLIES, AND RELATED METHODS

(75) Inventors: Jason L Strader, Cleveland, OH (US); Richard F Hill, Cleveland, OH (US)

(73) Assignee: Laird Technologies, Inc., Earth City, MO (US)

( * ) Notice: Subject to any disclaimer, the term of this patent is extended or adjusted under 35 U.S.C. 154(b) by 324 days.

(21) Appl. No.: 12/816,735

(22) Filed: Jun. 16, 2010

(65) Prior Publication Data

US 2011/0310562 A1 Dec. 22, 2011

(51) Int. Cl.
*B32B 1/00* (2006.01)
*B05D 1/36* (2006.01)

(52) U.S. Cl.
USPC ........... 428/614; 428/642; 428/686; 427/180; 427/445

(58) Field of Classification Search
USPC ................................................. 428/545, 614
See application file for complete search history.

(56) References Cited

U.S. PATENT DOCUMENTS

| | | | |
|---|---|---|---|
| 5,074,947 A | | 12/1991 | Estes et al. |
| 5,229,198 A | * | 7/1993 | Schroeder ........................ 442/7 |
| 5,723,369 A | | 3/1998 | Barber |
| 6,791,839 B2 | * | 9/2004 | Bhagwagar .................. 361/705 |
| 6,814,584 B2 | | 11/2004 | Zaderej |
| 7,019,971 B2 | * | 3/2006 | Houle et al. .................. 361/699 |
| 7,462,939 B2 | * | 12/2008 | Sundstrom .................... 257/778 |
| 2002/0086801 A1 | * | 7/2002 | Khatri ........................... 508/161 |
| 2005/0260431 A1 | * | 11/2005 | Wolki et al. ................... 428/626 |
| 2007/0048520 A1 | | 3/2007 | Hasio et al. |
| 2007/0290310 A1 | | 12/2007 | Kusano et al. |

OTHER PUBLICATIONS

CoolPolymers web publication, Internet Archive of 'www.coolpolymers.com/elastomers.asp' dated Jun. 18, 2006.*
Written Opinion of the International Searching Authority dated Jan. 11, 2012, for International Patent Application No. PCT/US2011/036623 (published as WO 2011/159417 on Dec. 22, 2011), which claims priority to the subject patent application, 7 pages.
International Search Report dated Jan. 11, 2012, for International Patent Application No. PCT/US2011/036623 (published as WO 2011/159417 on Dec. 22, 2011), which claims priority to the subject patent application, 4 pages.

* cited by examiner

*Primary Examiner* — David Sample
*Assistant Examiner* — Adam Krupicka
(74) *Attorney, Agent, or Firm* — Harness, Dickey & Pierce, P.L.C.

(57) ABSTRACT

A thermal interface material (TIM) assembly is provided for use in conducting heat away from heat generating components. The TIM assembly generally includes a substrate, a metal alloy coupled to at least one side surface of the substrate, and a coating material covering at least part of the substrate and at least part of the metal alloy. The substrate may include a metal foil, a heat dissipating unit, a heat generating component, etc. The metal alloy may include a low melting metal alloy coupled to the substrate to form multiple bumps along the substrate in a pattern. The pattern may be generic such that the TIM assembly may be used with multiple different heat generating components to effectively conduct heat away from the multiple different heat generating components, or it may correspond to particular locations on a heat generating component away from which heat is to be conducted.

29 Claims, 7 Drawing Sheets

THERMAL INTERFACE MATERIAL ASSEMBLIES, AND RELATED METHODS

FIELD

The present disclosure relates to thermal interface material assemblies, and related methods.

BACKGROUND

This section provides background information related to the present disclosure which is not necessarily prior art.

Electrical components, such as semiconductors, transistors, etc., typically have pre-designed temperatures at which the electrical components optimally operate. Ideally, the pre-designed temperatures approximate the temperature of the surrounding air. But the operation of electrical components generates heat which, if not removed, can cause the electrical components to operate at temperatures significantly higher than normal or desirable operating temperature. Such excessive temperatures may adversely affect the operating characteristics of the electrical component and the operation of any associated devices. To avoid or at least reduce the adverse operating characteristics from the heat generation, the heat should be removed, for example, by conducting the heat from the operating electrical components to heat sinks. The heat sinks may then be cooled by conventional convection and/or radiation techniques. During conduction, the heat may pass from the operating electrical components to the heat sinks either by direct surface contact between the electrical components and heat sinks and/or by contact of the electrical components and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor. In some devices, an electrical insulator may also be placed between the electrical component and the heat sink, in many cases this is the TIM itself.

SUMMARY

This section provides a general summary of the disclosure, and is not a comprehensive disclosure of its full scope or all of its features.

Example embodiments of the present disclosure generally relate to thermal interface material assemblies. In one example embodiment, a thermal interface material assembly generally includes a substrate, a metal alloy coupled to the substrate and defining at least one thermally conductive portion protruding away from the substrate, and a coating material covering at least part of the substrate and at least part of the metal alloy.

In another example embodiment, a thermal interface material assembly is configured to be coupled to a heat generating component for use in conducting heat away from the heat generating component. In this example embodiment, the thermal interface material assembly generally includes a substrate formed from a metallic foil, a low melting metal alloy soldered to the substrate and defining at least one thermally conductive portion protruding away from the substrate, and a coating material covering at least part of the substrate and at least part of the low melting metal alloy. The low melting metal alloy is soldered to at least one side portion of the substrate such that the low melting alloy forms a pattern along the at least one side portion.

Example embodiments of the present disclosure also generally relate to methods of making thermal interface materials. In one example embodiment, a method of making a thermal interface material assembly for use in conducting heat away from a heat generating component generally includes coupling a metal alloy to at least one side surface of a substrate, and coating at least part of the substrate and at least part of the metal alloy with a thermally conductive coating material The metal alloy defines at least one thermally conductive portion protruding away from the substrate.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 6:
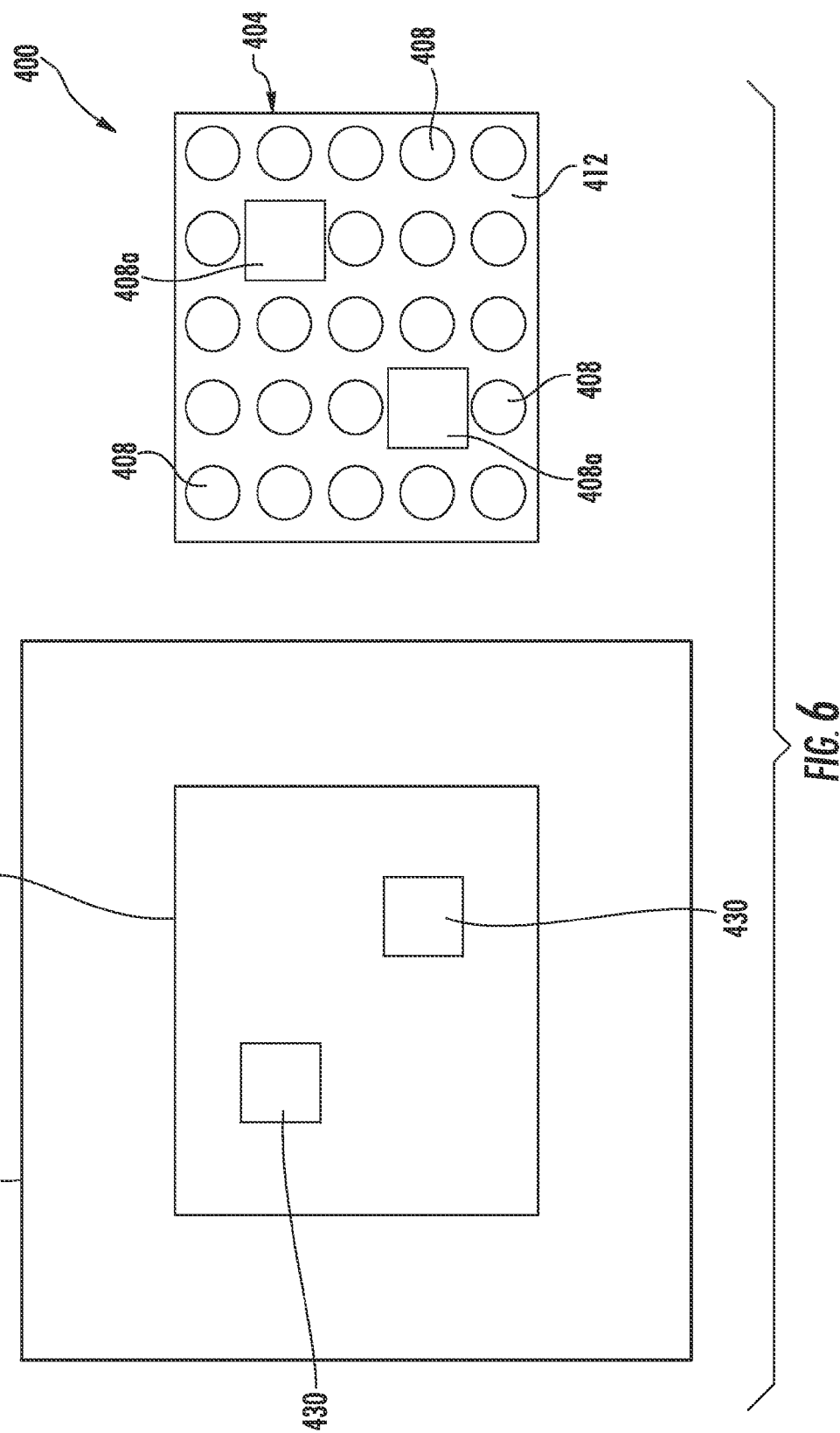
Figure 7:
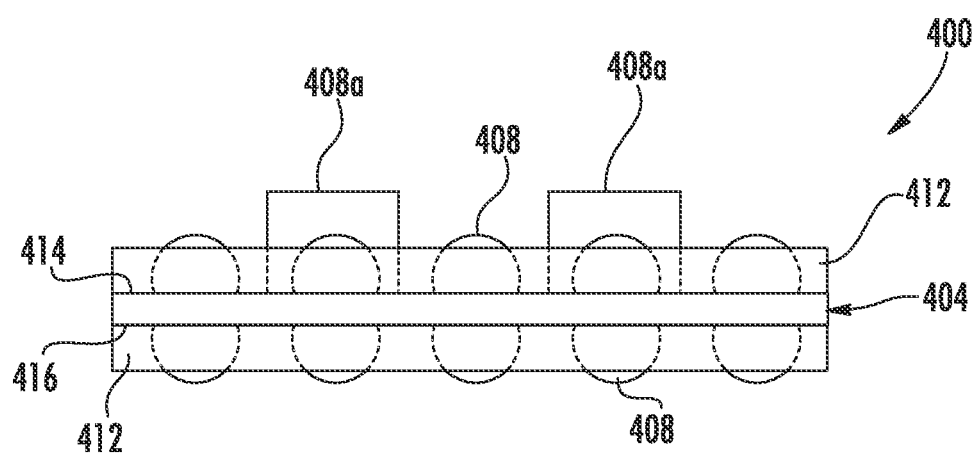

FIG. 6 is a top plan view of an example embodiment of a TIM assembly having thermally conductive portions extending away from first and second side portions of a base of the TIM assembly, including a pair of square-shaped thermally conductive portions provided to correspond to a pair of square-shaped hot-spot locations of a bare dice of a central processing unit to which the TIM assembly is to be coupled; and FIG. 7 is an elevation view of the TIM assembly of FIG. 6.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Example embodiments of the present disclosure generally relate to assemblies and methods for helping conduct thermal energy (e.g. heat, etc.) away from heat generating components. As used herein, heat generating components may include, but are not limited to, computer chips, braking systems, heating elements, power converters, amplification chips, insulated-gate bipolar transistors (IGBT), graphics processing units (GPU), memory chips, semiconductors, transistors, any various other electronics system components, etc. The example embodiments of the present disclosure may also be used in connection with electromagnetic shielding operations within the scope of the present disclosure.

Figure 1:
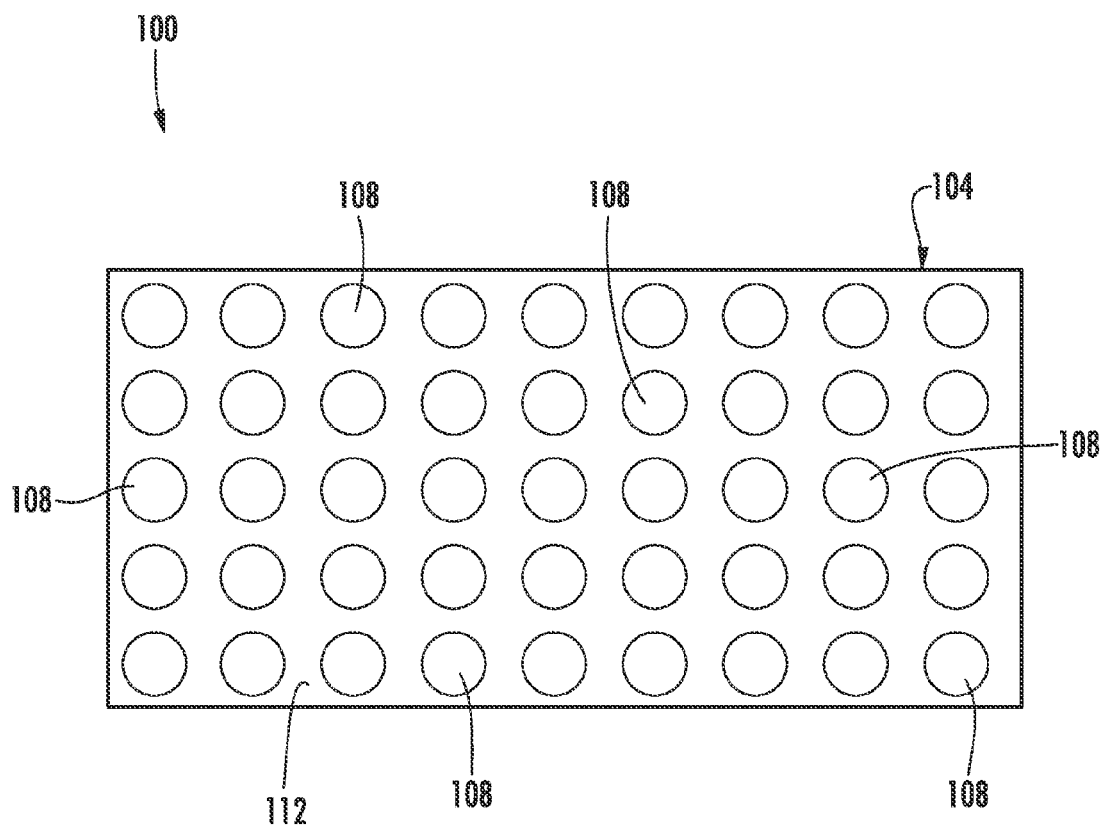
FIG. 1 is a top plan view of an example embodiment of a thermal interface material (TIM) assembly having thermally conductive portions extending away from first and second side portions of a base of the TIM assembly.
Figure 2:
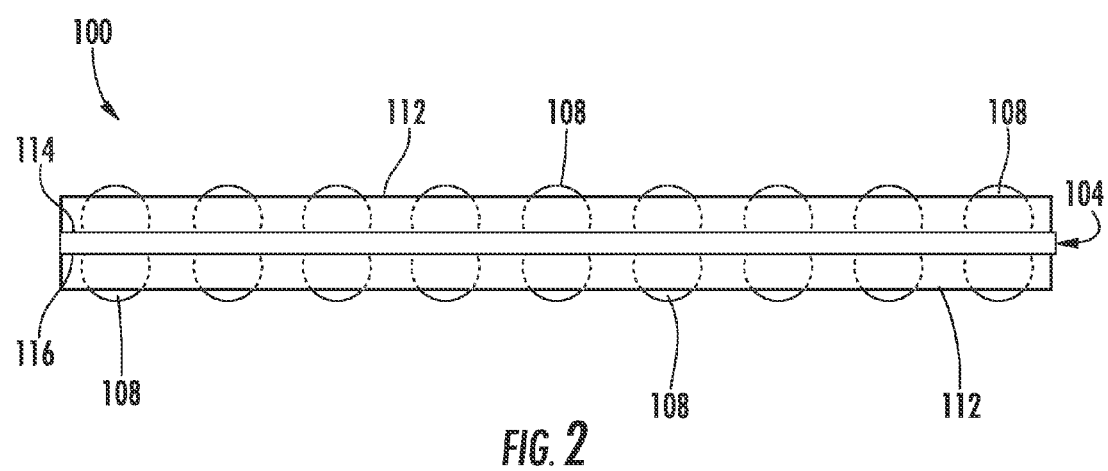
FIG. 2 is an elevation view of the TIM assembly of FIG. 1.

With reference now to the drawings, FIGS. 1 and 2 illustrate an example embodiment of a thermal interface material (TIM) assembly 100 including one or more aspects of the present disclosure. The TIM assembly 100 is configured to be coupled to a heat generating component such that the TIM assembly 100 can be used, for example, to help conduct thermal energy (e.g. heat, etc.) away from the heat generating component, etc. For example, the TIM assembly 100 may be coupled to a heat generating component generally between the heat generating component and a heat dissipating device (e.g., a heat spreader, a heat sink, a heat pipe, etc.). The TIM assembly 100 can then function to transfer heat from the heat generating component to the heat dissipating device.

The illustrated TIM assembly 100 includes a base 104 (broadly, a substrate), multiple protruding thermally conductive portions (e.g., protrusions, etc.) 108 extending away from the base 104 (e.g., protruding outwardly relative to (or away from) the base 104, etc.), and a coating material 112 applied to the base 104 and the thermally conductive portions 108. The base 104 is configured to conduct thermal energy across the base 104 as desired, for example, from a first side portion 114 of the base 104 to an opposing second side portion 116 of the base 104 for use in cooling a heat generating component, etc. The illustrated base 104 is constructed from copper having a thermal conductivity of about 400 Watts per meter Kelvin; and the copper is made into a foil (e.g., such that the base 104 is a foil layer, etc.) having a thickness of about 0.002 inches (about 0.05 millimeters). The base 104 may, however, be constructed from another suitable thermally conductive material within the scope of the present disclosure, for example, a metal other than copper (e.g., tin, nickel, silver, gold, nickel plated copper, nickel plated aluminum, another metal that can be made into a foil, etc.), a metal alloy, a metallic foil, a ceramic material sputter coated with a metal (e.g., gold, solder, etc.), a graphite material sputter coated with a metal (e.g., gold, solder, etc.), etc. In addition, the base 104 may have any desired thermal conductivity and/or any desired thickness within the scope of the present disclosure, for example, a thermal conductivity greater than or less than about 400 Watts per meter Kelvin and/or a thicknesses greater than or less than about 0.002 inches (about 0.05 millimeters), etc. Moreover, the base 104 may have any desired shape within the scope of the present disclosure.

The thermally conductive portions 108 extending away from the base 104 operate as part of the TIM assembly 100 to help conduct thermal energy to and/or away from the base 104 as desired (e.g., from a heat generating component to the base 104, from the base 104 to a heat dissipating device, etc.). The illustrated thermally conductive portions 108 are formed from $In_{51}Bi_{32.5}Sn_{16.5}$, a low melting phase change metal alloy (PCMA) having a melting temperature of about 60 degrees Celsius. The thermally conductive portions 108 may, however, be formed from another suitable thermally conductive material within the scope of the present disclosure, for example, a low melting PCMA other than $In_{51}Bi_{32.5}Sn_{16.5}$, a eutectic metal alloy, a non-eutectic metal alloy, a metal or a metal alloy with a melting temperature below about 160 degrees Celsius, other metal alloys, etc.

In the illustrated embodiment, the thermally conductive portions 108 are shaped as generally circular bumps soldered (broadly, coupled) to the first and second side portions 114 and 116 of the base 104 (FIG. 2). The bumps are located generally uniformly (e.g., in generic patterns suitable for use with multiple different heat generating components, etc.) along the entire first and second side portions 114 and 116 such that the bumps substantially cover entire surfaces of the first and second side portions 114 and 116. In addition in the illustrated embodiment, each of the base's side portions 114 and 116 includes forty-five total bumps oriented into an array having five rows of bumps and nine columns. The base's side portions 114 and 116 may, however, include a number of bumps greater than or fewer than forty-five (e.g., depending on desired operations, etc.) within the scope of the present disclosure. In addition, the bumps may have any desired size within the scope of the present disclosure.

In other example embodiments, TIM assemblies may include thermally conductive portions having shapes other than bumps, for example, bar shapes, star shapes, conical shapes, pyramid shapes, half-circle shapes, rod shapes, etc. In still other example embodiments, TIM assemblies may include thermal conductive portions coupled/formed to bases by operations other than soldering. For example, bases may be perforated and thermally conductive portions may be pin shaped, and the pin-shaped thermally conductive portions may be pushed through the perforations in the bases so that they protrude from opposing first and second side portions of the bases. As another example, thermally conductive portions may be clad or stamped to one or both side portions of bases.

In still other example embodiments, TIM assemblies may include thermally conductive portions oriented across one or more side portions of bases differently than illustrated in FIG. 1 (e.g., other than uniformly, etc.). For example, thermally conductive portions may be provided in desired patterns (e.g., bulls-eye patterns, stripe patterns, zig-zag patterns, etc.); in patterns based on particular operational requirements of the TIM assemblies (e.g., based on cooling requirements, etc.); in patterns based on sizes and/or shapes of heat generating components to be cooled; in patterns corresponding to particular locations on heat generating components away from which heat is to be conducted by the TIM assemblies; in generic patterns that do not specifically match particular locations on heat generating components away from which heat is to be conducted but that are configured such that the TIM assemblies may be used with multiple different heat generating components to effectively conduct heat away from the multiple different heat generating components, etc. Alternatively, TIM assemblies may include thermally conductive portions randomly provided over bases.

In still other example embodiments, TIM assemblies may include bases having thermally conductive portions provided over only parts of the bases. In still other example embodiments, TIM assemblies may include bases having thermally conductive portions provided over parts of the bases at specific locations and/or in specific patterns corresponding to one or more hot spots on surfaces of heat generating components to which the TIM assemblies are to be coupled. Here, the thermally conductive portions may be provided in desired patterns generally mirroring the one or more hot spots on the heat generating components' surfaces. This may allow for higher thermal transfer over the one or more hot spots while maintaining acceptable performance over other areas of the heat generating components' surfaces. And moreover, the remainder of the bases may be coated with coating material to help inhibit oxidation of the thermally conductive portions and further help cool the one or more hot spots on the heat generating components' surfaces as desired.

With continued reference to FIGS. 1 and 2, the coating material 112 applied to the base 104 and thermally conductive portions 108 is configured to help inhibit oxidation of the base 104 and the thermally conductive portions 108 by functioning as a barrier to air. The coating material 112 is also configured to help contain migration of the thermally conductive portions 108 (e.g., the bumps, etc.) during operation of the TIM assembly 100. For example, the coating material 112 operates as a barrier to generally contain the thermally conductive portions 108 on the base 104 during operation of the TIM assembly 100 so that the heated thermally conductive portions 108 will not fall off (lose surface tension with the base 104) if the TIM assembly 100 is inadvertently exposed to a shock.

The coating material 112 may include any suitable material within the scope of the present disclosure including, for example, phase change materials (PCM's), polymers, paraffin waxes, gap fillers, greases, cured silicone pads, cured non-silicone pads, cure-in-place gels or putties, etc. depending on operational applications and/or desired properties of the TIM assembly 100. The coating material 112 may have any suitable melting temperature within the scope of the present disclosure, for example, a melting temperature that is lower than, about the same as, etc. the melting temperature of the thermally conductive portions 108. For example, the illustrated coating material 112 may have a melting temperature of between about 40 degrees Celsius and about 60 degrees Celsius. And, the coating material 112 may be softer than the thermally conductive portions 108 within the scope of the present disclosure. The coating material 112 may also have any desired thickness within the scope of the present disclosure. For example, the coating material 112 may have a thickness that is thinner than the thermally conductive portions 108, or the coating material 112 may have a thickness that is about the same as the thickness of the thermally conductive portions 108, or thicker than the thermally conductive portions 108.

The coating material 112 may also help take up mismatches in coefficients of thermal expansion between the TIM assembly 100 and a heat generating component to which the TIM assembly 100 is coupled at operating temperatures below the melting temperature of the thermally conductive portions 108. As such, the coating material 112 may provide a more conformable/compliant material at these lower temperatures (as compared to the thermally conductive portions 108) for improving surface contact between the TIM assembly 100 and the heat generating component (e.g., for better conforming to gaps/surface imperfections in the heat generating component, etc.) and thus help create a better heat path therebetween. At operating temperatures above the melting temperature of the thermally conductive portions 108, both the coating material 112 and the thermally conductive portions 108 will melt and will operate to flow into imperfection in the heat generating component to thereby together help improve surface contact between the TIM assembly 100 and the heat generating component. The thermally conductive portions 108 and/or the coating material 112 may thus also provide a naturally tacky adhesion to the heat generating component and/or a heat dissipating device.

The coating material 112 may also operate as part of the TIM assembly 100 to help conduct at least some thermal energy to and/or away from the base 104 as desired (e.g., from a heat generating component to the base 104, from the base 104 to a heat dissipating device, etc.). Further, the coating material 112 may be thermally enhanced as desired to improve/enhance conduction of thermal energy through the coating material to and/or away from the base 104. For example, additives such as ceramic particles, metallic particles, etc. may be added to the coating material 112 to provide such improved/enhanced conduction of thermal energy.

As previously noted, wide ranges of different coating materials may be used in example embodiments of TIM assemblies of the present disclosure. In some example embodiments, for example, coating materials may have thermal conductivities of at least about 1 W/mK (Watts per meter-Kelvin) or more, such as copper-based coating materials having thermally conductivities up to several hundred W/mK, etc. Additional suitable coating materials may include, for example, zinc oxide, boron nitride, alumina, aluminum, graphite, ceramics, combinations thereof (e.g., alumina and zinc oxide, etc.). In addition, example embodiments of TIM assemblies may also include different grades (e.g., different sizes, different purities, different shapes, etc.) of the same (or different) coating materials. For example, TIM assemblies may include two different sizes of boron nitride, etc. By varying the types and grades of coating materials, final characteristics of the TIM assemblies (e.g., thermal conductivity, cost, hardness, etc.) may be varied as desired.

Suitable coating materials may also include other additives to so that TIM assemblies formed using the coating materials can achieve various desired outcomes. For example, coating materials may further include pigments, plasticizers, process aids, flame retardants, extenders, electromagnetic interface (EMI) or microwave absorbers, electrically-conductive fillers, magnetic particles, tackifying agents to increase the tackiness of a thermal interface material, etc.

Figure 3:
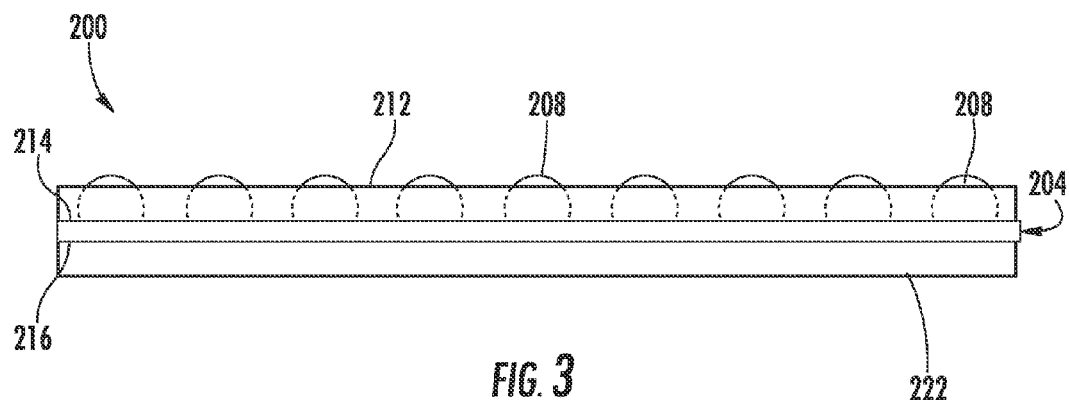
FIG. 3 is an elevation view of an example embodiment of a TIM assembly having thermally conductive portions extending away from a first side portion of a base of the TIM assembly.

FIG. 3 illustrates another example embodiment of a TIM assembly 200 including one or more aspects of the present disclosure. The TIM assembly 200 of this embodiment is similar to the TIM assembly 100 previously described and illustrated in FIGS. 1 and 2. For example, the illustrated TIM assembly 200 includes a base 204 (broadly, a substrate), multiple protruding thermally conductive portions 208 extending away from the base 204 (e.g., providing a bump coated construction, etc.), and a coating material 212 applied to the base 204 and the thermally conductive portions 208. In addition, the thermally conductive portions 208 are shaped as generally circular bumps soldered to a first side portion 214 of the base 204. In this example embodiment, however, a second side portion 216 of the base 204 does not include thermally conductive portions. Instead, the second side portion 216 of the base 204 includes only a coating material 222. The coating material 222 may be the same coating material as applied to the base 204 and the thermally conductive portions 208 on the first side portion 214 of the base 204, or it may be different within the scope of the present disclosure.

Figure 4:
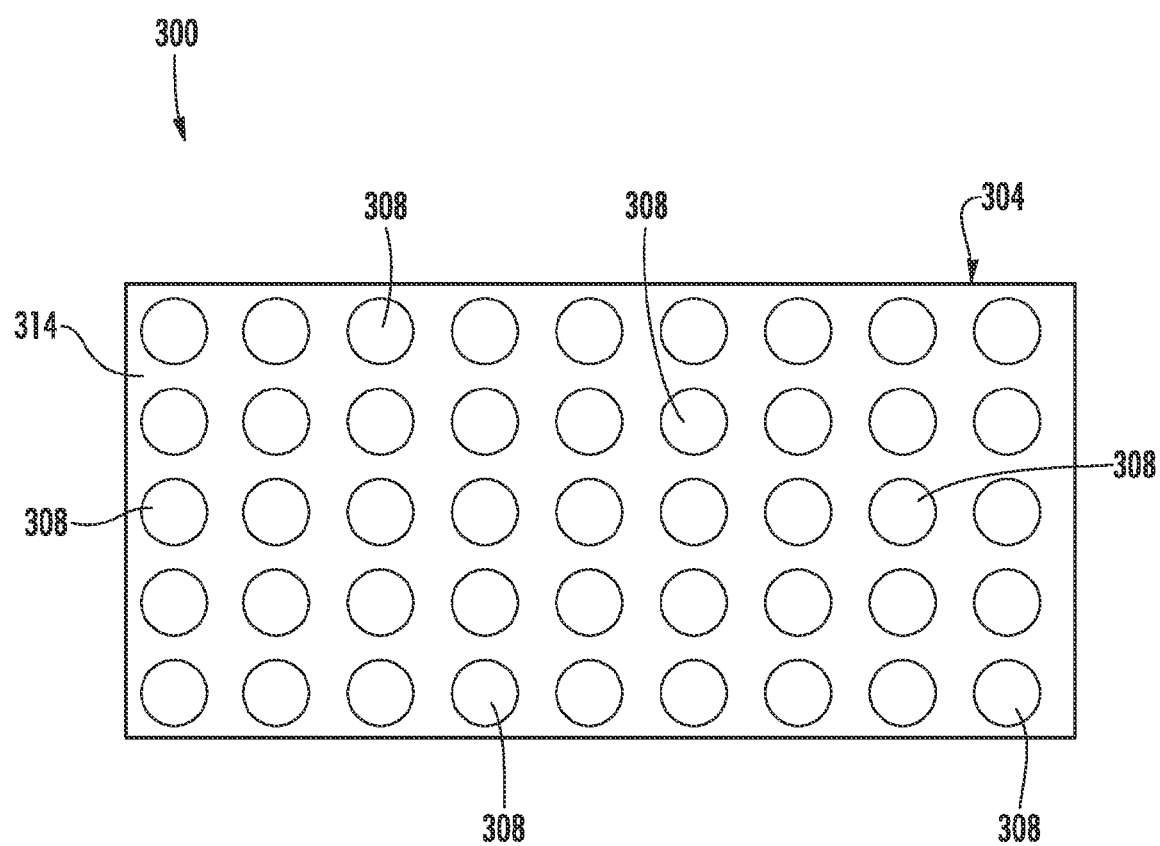
FIG. 4 is a top plan view of an example embodiment of a TIM assembly having thermally conductive portions extending away from first and second side portions of a base of the TIM assembly but with no coating material applied thereto.
Figure 5:
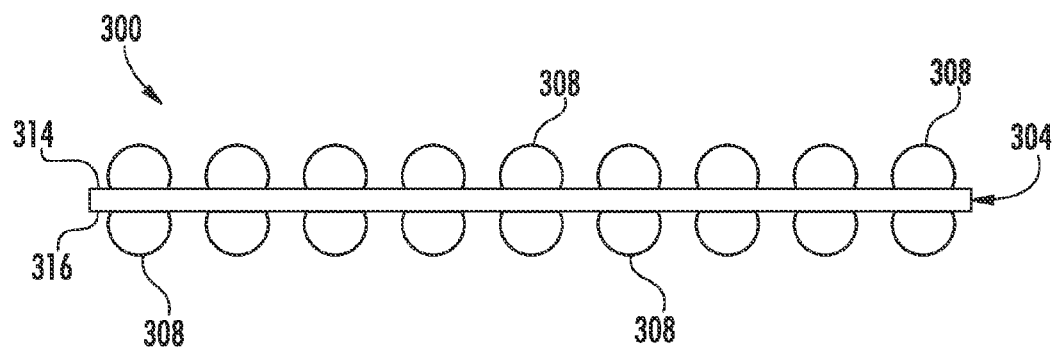
FIG. 5 is an elevation view of the TIM assembly of FIG. 4.

FIGS. 4 and 5 illustrate another example embodiment of a TIM assembly 300 including one or more aspects of the present disclosure. The TIM assembly 300 of this embodiment is similar to the TIM assembly 100 previously described and illustrated in FIGS. 1 and 2. For example, the illustrated TIM assembly 300 includes a base 304 (broadly, a substrate) and multiple protruding thermally conductive portions 308 extending away from the base 304 for use in conducting thermal energy away from a heat generating component. In addition, the thermally conductive portions 308 are shaped as generally circular bumps soldered to first and second side portions 314 and 316 of the base 304 (e.g., providing a bump coated construction, etc.). In this example embodiment, however, the TIM assembly 300 does not include coating material applied to the base 304 and the thermally conductive portions 308.

FIGS. 6 and 7 illustrate another example embodiment of a TIM assembly 400 including one or more aspects of the present disclosure. The TIM assembly 400 of this embodiment is similar to the TIM assembly 100 previously described and illustrated in FIGS. 1 and 2. For example, the illustrated TIM assembly 400 includes a base 404 (broadly, a substrate), multiple protruding thermally conductive portions 408 extending away from the base 404, and a coating material 412 applied to the base 404 and the thermally conductive portions 408. In addition, the thermally conductive portions 408 are shaped as generally circular bumps soldered to first and second side portions 414 and 416 of the base 404 (e.g., providing a bump coated construction, etc.). And, the coating material 412 is applied to the base 404 and the thermally conductive portions 408 along both the first and second side portions 414 and 416 of the TIM assembly 400.

As shown in FIG. 6, the TIM assembly 400 of this embodiment also includes a pair of square-shaped thermally conductive portions (each indicated at reference number 408a) positioned along the first side portion 414 of the base 404 with the circular-shaped thermally conductive portions 408. The circular-shaped thermally conductive portions 408 are located in a generally generic pattern along the first side portion 414 of the base 404. And, the square-shaped thermally conductive portions 408a are provided, in addition to the circular-shaped thermally conductive portions 408, to correspond to a pair of square-shaped hot-spot locations (each indicated at reference number 430) of a bare dice 432 and a central processing unit 434 to which the TIM assembly 400 is to be coupled. As such, the square-shaped thermally conductive portions 408a are particularly shaped and particularly located (and patterned) (independent of the generically patterned circular-shaped thermally conductive portions 408) to generally overlap the hot-spot locations 430 of the bare dice 432 when the TIM assembly is coupled thereto (with the first side portion 414 of the base 404 generally facing the bare dice 432). Providing this particular shape and location of the thermally conductive portions 408a may help improve heat dissipation from the bare dice 432 and/or central processing unit 434. In other example embodiments, TIM assemblies may include thermally conductive portions having shapes other than squares to correspond to hot-spot locations of heat generating components having shapes other than squares. In still other example embodiments, TIM assemblies may include bases having thermally conductive portions particularly shaped and/or particularly located along side portions of the bases to generally overlap hot-spot locations of heat generating components without also having additional thermally conductive portions located in generic patterns along the side portions.

With additional reference to FIG. 7, the square-shaped thermally conductive portions 408a are generally taller than the circular-shaped thermally conductive portions 408. This may help improve contact between the square-shaped thermally conductive portions 408a and the square-shaped hot-spot locations 430 of the bare dice 432 and promote heat transfer away from the bare dice 432. In other example embodiments, TIM assemblies may include bases having both particularly patterned square-shaped thermally conductive portions and generically patterned circular-shaped thermally conductive portions where the square-shaped thermally conductive portions are about the same height as the circular-shaped thermally conductive portions.

As also shown in FIG. 7, the second side portion 416 of the base 404 includes multiple circular-shaped thermally conductive portions 408 positioned there along. In this embodiment, the circular-shaped thermally conductive portions 408 are located along the second side portion 416 in a generally generic pattern mirroring the generally generic pattern of the circular-shaped thermally conductive portions 408 positioned along the first side portion 414 of the base 404. And, additional thermally conductive portions (e.g., square shaped thermally conductive portions such as portions 408a, etc.) to correspond hot-spot locations on a heat generating component are not provided along the second side portion 416. In other example embodiments, however, TIM assemblies may include bases having thermally conductive portions particularly shaped and/or particularly located along both first and second side portions of the bases to generally overlap hot-spot locations of heat generating components.

In other example embodiments, TIM assemblies may include thermally conductive portions coupled to (e.g., formed to, soldered to, etc.) and extending away from substrates such as, for example, bare die, lidded packages, heat dissipating devices (e.g., heat spreaders, heat sinks, heat pipes, etc.). In these example embodiments, the TIM assemblies may not include bases such as foil layers, etc. and may thereby provide fewer components through which thermal energy must be conducted when used to conduct thermal energy away from heat generating components (thus operating with less thermal resistance).

In still other example embodiments, TIM assemblies may include thermally conductive portions formed by building up multiple layers of material, for example, solder, etc. having different melting points.

In still other example embodiments, TIM assemblies may be included as part of electromagnetic interference (EMI) devices. EMI may include both electromagnetic interference and radio frequency interference (RFI) emissions. In these example embodiments, coating materials in the TIM assemblies may be configured to provide at least some EMI shielding. For example, the coating materials may include magnetic particles, EMI or microwave absorbers, electrically conductive fillers, or electromagnetic absorbing materials, such as carbonyl iron, iron silicide, iron particles, iron-chrome compounds, metallic silver, carbonyl iron powder, SENDUST (an alloy containing 85% iron, 9.5% silicon and 5.5% aluminum), permalloy (an alloy containing about 20% iron and 80% nickel), ferrites, magnetic alloys, magnetic powders, magnetic flakes, magnetic particles, nickel-based alloys and powders, chrome alloys, and any combinations thereof. Other embodiments may include one or more EMI absorbers formed from one or more of the above materials where the EMI absorbers comprise one or more of granules, spheroids, microspheres, ellipsoids, irregular spheroids, strands, flakes, powder, and/or a combination of any or all of these shapes. Accordingly, some example embodiments may thus include TIM assemblies that include or are based on thermally reversible gels, where the TIM assemblies are also configured (e.g., include or are loaded with EMI or microwave absorbers, electrically-conductive fillers, and/or magnetic particles, etc.) to provide shielding.

By way of background, EMI absorbers convert electromagnetic energy into another form of energy through a process commonly referred to as a loss. Electrical loss mechanisms include conductivity losses, dielectric losses, and magnetization losses. Conductivity losses refer to a reduction in EMI resulting from the conversion of electromagnetic energy into thermal energy. The electromagnetic energy induces currents that flow within the EMI absorbers having a finite conductivity. The finite conductivity results in a portion of the induced current generating heat through a resistance. Dielectric losses refer to a reduction in EMI resulting from the conversion of electromagnetic energy into mechanical displacement of molecules within the EMI absorbers having a non-unitary relative dielectric constant. Magnetic losses refer to a reduction in EMI resulting from the conversion of electromagnetic energy into a realignment of magnetic moments within the EMI absorbers.

In some example embodiments, TIM assemblies including thermally-reversible gels may be attached or affixed (e.g., adhesively bonded, etc.) to one or more portions of an EMI shield, such as to a single piece EMI shield and/or to a cover, lid, frame, or other portion of a multi-piece shield, to a discrete EMI shielding wall, etc. Alternative affixing methods can also be used such as, for example, mechanical fasteners. In some embodiments, TIM assemblies that include thermally-reversible gel may be attached to a removable lid or cover of a multi-piece EMI shield. A thermal interface material that includes thermally-reversible gel may be placed, for example, on the inner surface of the cover or lid such that the TIM assembly will be compressively sandwiched between the EMI shield and an electronic component over which the EMI shield is placed. Alternatively, a TIM assembly that includes thermally-reversible gel may be placed, for example, on the outer surface of the cover or lid such that the TIM assembly is compressively sandwiched between the EMI shield and a heat sink. A TIM assembly that includes thermally-reversible gel may be placed on an entire surface of the cover or lid or on less than an entire surface. A TIM assembly that includes thermally-reversible gel may be applied at virtually any location at which it would be desirable to have an EMI absorber.

In some example embodiments, TIM assemblies may include adhesive layers. The adhesive layers may be thermoconductive adhesives to preserve overall thermal conductivity. The adhesive layers may be used to affix the TIM assemblies to electronic components, heat sinks, EMI shields, etc. as desired. The adhesive layers may be formulated using pressure-sensitive, thermally-conducting adhesives. The pressure-sensitive adhesives (PSA) may be generally based on compounds including acrylic, silicone, rubber, and combinations thereof. The thermal conductivity is enhanced, for example, by the inclusion of ceramic powder.

An example method for making a TIM assembly (e.g., TIM assembly 100, TIM assembly 200, etc.) will now be described. Copper foil (broadly, a substrate) is coated (e.g., laminated, etc.) with a dry film photo resist that is then covered with a transparency (e.g., a stencil, etc.) having a desired bump (broadly, thermally conductive portion) pattern. The dry film photo resist is then subjected to a curing operation using ultraviolet light. Portions of the dry film photo resist not covered by the transparency are cured. And, portions of the dry film photo resist covered with the transparency (corresponding to the bump pattern of the transparency) are not cured. The uncured portions of the dry film photo resist are washed away using a dry film developer. This leaves exposed areas of bare copper over the surface of the copper foil corresponding to the bump pattern from the transparency.

The copper foil and cured dry film photo resist are next bump plated with a metal alloy (broadly, the metal alloy is coupled to the copper foil and cured dry film photo resist). This includes dipping the copper foil and cured dry film photo resist into flux and then molten solder (e.g., $In_{51}Bi_{32.5}Sn_{16.5}$, etc.) to fill the areas of exposed bare copper with the solder (and thereby broadly couple the solder to the copper foil). The resulting product is then cooled to room temperature, rinsed, and dried, leaving solder bumps plated on the copper foil at the bare areas. The bump plated copper foil is processed (e.g., placed in a dry film stripper, etc.) to remove the cured dry film photo resist from the copper foil. The resulting product is washed and dried, leaving only the bump plated copper foil (with solder bumps at the desired locations corresponding to the original transparency). The bump pattern may be arranged as desired, for example, randomly, or in a generic pattern, or so that the locations of the bumps generally correspond to locations on a heat generating component to be cooled when the TIM assembly is coupled to the heat generating component, etc.

The bump plated copper foil is then coated (e.g., backfilled, etc.) with a coating material using suitable operations. As an example, the coating material can be dissolved in a solvent and the bump plated copper foil then dipped into the liquid solution thereby coating at least part of the solder bumps and copper foil. The solvent is then flashed off leaving the TIM assembly. In preparing the TIM assembly for subsequent storage, distribution, use, etc., liners may (although it is not required) then be introduced to the TIM assembly while the TIM assembly is sheeted or wound up into a roll. As another example, the coating material may be preformed into rolls of material of desired thicknesses and then laminated to side surfaces of the bump plated copper foil with laminating rolls. The resulting TIM assembly may then be sheeted or rolled up. And as still another example, the coating material may be of a lower softening point than the solder bumps such that the coating material may be heated above its melting temperature and then laminated to the bump plated copper foil. This can include applying the molten coating material to liners, introducing the liners to upper and lower side surfaces of the bump plated copper foil, and then moving the entire assembly through laminating rolls (such that the assembling moving through the rolls generally includes a lower liner, coating material, the bump plated copper foil, coating material, and an upper liner). The laminating rolls and support table leading up to them will be heated to a temperature that is greater than the melting temperature of the coating material but below the melting temperature of the solder bumps. Upon exiting the laminating rolls, the TIM assembly material can then be sheeted or would into a roll.

In other example embodiments, methods for making TIM assemblies may include screen printing bases with solder pastes in desired patterns and then processing the printed bases through reflow ovens.

In still other example embodiments, methods for making TIM assemblies may include directly bump plating heat dissipating devices, heat generating components, etc. with metal alloys (e.g., solder, etc.). Suitable coating materials are then applied to the bump plated portions of the heat dissipating devices, heating generating components, etc. using, for example, solvent systems and stencils, etc. In some example embodiments, surfaces of the heat dissipating devices, heat generating components, etc. that are to be bump coated may need to be pre-coated with metal such as gold, nickel, etc. to provide a suitable surface to which the metal alloys can be bump plated.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (the disclosure of a first value and a second value for a given parameter can be interpreted as disclosing that any value between the first and second values could also be employed for the given parameter). Similarly, it is envisioned that disclosure of two or more ranges of values for a parameter (whether such ranges are nested, overlapping or distinct) subsume all possible combinations of ranges for the value that might be claimed using endpoints of the disclosed ranges.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A thermal interface material assembly comprising:
    a substrate;
    a metal alloy coupled to the substrate and defining at least one thermally conductive portion protruding away from the substrate, the metal alloy having a melting temperature of about 160 degrees Celsius or less; and
    a thermally conductive coating material covering at least part of the substrate and at least part of the metal alloy, the thermally conductive coating material having a melting temperature equal to or less than the melting temperature of the metal alloy;
    wherein the thermally conductive coating material is applied to the at least one thermally conductive portion, whereby the thermally conductive coating material inhibits oxidation of the at least one thermally conductive portion by functioning as a barrier to air and contains migration of the at least thermally conductive portion during operation of the thermal interface material assembly; and
    wherein the at least one thermally conductive portion includes at least one bump protruding away from the substrate, and wherein the metal alloy is coupled to the substrate to form multiple bumps along a same side of the substrate, and wherein the thermally conductive coating material has a thermal conductivity of at least 1 Watt per meter per Kelvin.

2. The assembly of claim 1, wherein the substrate includes first and second oppositely facing side portions, and wherein the metal alloy is coupled to the substrate to form multiple bumps disposed along the first side portion of the substrate and multiple bumps along the second side portion of the substrate.

3. The assembly of claim 1, wherein the multiple bumps are arranged in a pattern along the substrate, and wherein the multiple bumps are covered substantially entirely with the thermally conductive coating except for end portions of the multiple bumps.

4. The assembly of claim 3, wherein the pattern is a generic pattern configured such that the thermal interface material assembly is usable with multiple different electronic heat generating components, wherein the substrate includes first and second oppositely facing side portions, and wherein the bumps are located generally uniformly along the entire first and second oppositely facing side portions such that the bumps substantially cover the entire surfaces of the first and second oppositely facing side portions.

5. The assembly of claim 1, wherein the metal alloy is soldered to the substrate, and wherein the thermally conductive coating and the at least one thermally conductive portion will melt and flow at an operating temperature equal to or higher than the melting temperature of the metal alloy.

6. The assembly of claim 1, wherein the metal alloy includes a low melting phase change metal alloy, and wherein the thermally conductive coating is a phase change material within an operating temperature of an electronic component.

7. The assembly of claim 6, wherein the low melting phase change metal alloy includes $In_{51}Bi_{32.5}Sn_{16.5}$ and/or wherein the low melting phase change metal alloy has a melting temperature of about 60 degrees Celsius.

8. The assembly of claim 1, wherein the metal alloy has a melting temperature of about 60 degrees Celsius or less, and wherein the thermally conductive coating material has a melting temperature less than the melting temperature of the metal alloy, such that the thermally conductive coating material is more conformable than the metal alloy at the melting temperature of the thermally conductive coating material.

9. The assembly of claim 1, wherein the thermally conductive coating material is a phase change material, a grease, a cured silicone pad, a cured non-silicone pad, a cure-in-place gel, a cure-in-place putty, or a paraffin wax.

10. The assembly of claim 1, wherein the thermally conductive coating material is configured to inhibit oxidation of the substrate and the metal alloy and to contain migration of the metal alloy during operation of the thermal interface material assembly to thereby prevent the at least one thermally conductive portion when heated from falling off or losing surface tension with the substrate if the thermal interface material assembly is exposed to a shock.

11. An electronics system including a heat generating component and the assembly of claim 1 coupled to the heat generating component, whereby the thermally conductive coating and the at least one thermally conductive portion will melt and flow at an operating temperature above the melting temperature of the metal alloy.

12. A thermal interface material assembly comprising:
a substrate;
a metal alloy coupled to the substrate and defining at least one thermally conductive portion protruding away from the substrate, the metal alloy having a melting temperature of about 160 degrees Celsius or less; and
a thermally conductive coating material covering at least part of the substrate and at least part of the metal alloy, the thermally conductive coating material having a melting temperature equal to or less than the melting temperature of the metal alloy;
wherein:
the thermally conductive coating material is applied to the at least one thermally conductive portion, whereby the thermally conductive coating material inhibits oxidation of the at least one thermally conductive portion by functioning as a barrier to air and contains migration of the at least thermally conductive portion during operation of the thermal interface material assembly;
the substrate is a single substrate having first and second oppositely facing sides;
the thermally conductive coating includes electrically-conductive fillers; and
the metal alloy is coupled to the single substrate to form multiple bumps along the first side portion and multiple bumps along the second side of the same single substrate.

13. The assembly of claim 12, wherein the thermally conductive coating material has a thermal conductivity of at least 1 Watt per meter per Kelvin.

14. A thermal interface material assembly comprising:
a substrate;
a metal alloy coupled to the substrate and defining at least one thermally conductive portion protruding away from the substrate, the metal alloy having a melting temperature of about 160 degrees Celsius or less; and
a thermally conductive coating material covering at least part of the substrate and at least part of the metal alloy, the thermally conductive coating material having a melting temperature equal to or less than the melting temperature of the metal alloy;
wherein the thermally conductive coating material is applied to the at least one thermally conductive portion, whereby the thermally conductive coating material inhibits oxidation of the at least one thermally conductive portion by functioning as a barrier to air and contains migration of the at least thermally conductive portion during operation of the thermal interface material assembly, and
wherein the substrate comprises metal, the thermally conductive coating material has a thermal conductivity of at least 1 Watt per meter per Kelvin, and the at least one thermally conductive portion includes at least one bar protruding away from the substrate, and wherein the metal alloy is coupled to the substrate to form multiple bars along a same side of a metal portion of the substrate.

15. A thermal interface material assembly configured to be coupled to an electronic heat generating component for use in conducting heat away from the electronic heat generating component, the assembly comprising:
a substrate formed from a metallic foil having first and second oppositely facing side portions;
a low melting metal alloy soldered to the substrate and defining at least one thermally conductive portion protruding away from the substrate, the low melting metal alloy having a melting temperature of about 160 degrees Celsius or less; and
a thermally conductive coating material covering at least part of the substrate and at least part of the low melting metal alloy, the thermally conductive coating material having a thermal conductivity of at least 1 Watt per meter per Kelvin and a melting temperature equal to or less than the melting temperature of the low melting metal alloy;
wherein the low melting metal alloy is soldered to at least one of the first and second oppositely facing side portions of the metallic foil such that the low melting alloy forms a pattern of thermally conductive portions along the at least one of said first and second oppositely facing side portions.

16. The assembly of claim 15, wherein the pattern is a generic pattern configured such that the thermal interface material assembly is usable with multiple different electronic heat generating components to effectively conduct heat away from the multiple different electronic heat generating components, and the thermally conductive portions are located generally uniformly along the entire first and second oppositely facing side portions such that the thermally conductive portions substantially cover the entire surfaces of the first and second oppositely facing side portions.

17. The assembly of claim 15, wherein the thermally conductive portions include multiple bumps protruding away from the at least one of said first and second oppositely facing side portions and multiple bumps protruding away from the other one of said first and second oppositely facing side portions.

18. The assembly of claim 15, wherein:
the substrate is a single metallic foil having the first and second oppositely facing side portions;
the thermally conductive coating includes electrically-conductive fillers and has a melting temperature of between about 40 degrees Celsius and about 60 degrees Celsius; and
the low melting metal alloy is soldered to the single metallic foil to form multiple bumps along the first side portion and multiple bumps along the second side of the same single substrate.

19. The assembly of claim 15, wherein:
the substrate is a single electrically conductive substrate having the first and second oppositely facing side portions;

the thermally conductive coating is electrically conductive and has a melting temperature of between about 40 degrees Celsius and about 60 degrees Celsius; and the low melting metal alloy is soldered to the single electrically conductive substrate to form multiple bumps along the first side portion and multiple bumps along the second side of the same single substrate.

20. A method of making a thermal interface material assembly for use in conducting heat away from an electronic heat generating component, the method comprising:

coupling a metal alloy to at least one side surface of a substrate, wherein the metal alloy defines at least one thermally conductive portion protruding away from the substrate, the metal alloy having a melting temperature of about 160 degrees Celsius or less; and coating at least part of the substrate and at least part of the metal alloy with a thermally conductive coating material having a melting temperate equal to or less than the melting temperature of the low melting metal alloy, wherein the thermally conductive coating material is applied to the at least one thermally conductive portion, whereby the thermally conductive coating material inhibits oxidation of the at least one thermally conductive portion by functioning as a barrier to air and contains migration of the at least thermally conductive portion during operation of the thermal interface material assembly;

wherein coupling the metal alloy to the at least one side surface of the substrate includes soldering the metal alloy to the at least one side surface of the substrate, wherein the thermally conductive coating material has a thermal conductivity of at least 1 Watt per meter per Kelvin.

21. The method of claim 20, wherein the substrate includes a portion having first and second oppositely facing sides, and wherein coupling the metal alloy to the at least one side surface of the substrate includes coupling the metal alloy to both the first and second oppositely facing sides to form multiple bumps along the first side and to form multiple bumps along the second side of the same portion of the substrate.

22. The method of claim 20, wherein the metal alloy includes a low melting phase change metal alloy, and wherein the thermally conductive coating is a phase change material within an operating temperature of an electronic component.

23. The method of claim 20, wherein the metal alloy has a melting temperature of about 60 degrees Celsius or less, and wherein the thermally conductive coating material has a melting temperature less than the melting temperature of the metal alloy, such that the thermally conductive coating material is more conformable than the metal alloy at the melting temperature of the thermally conductive coating material.

24. The method of claim 20, wherein the thermally conductive coating material is a phase change material, a grease, a cured silicone pad, a cured non-silicone pad, a cure-in-place gel, a cure-in-place putty, or a paraffin wax.

25. A method of making a thermal interface material assembly for use in conducting heat away from an electronic heat generating component, the method comprising:

coupling a metal alloy to at least one side surface of a substrate, wherein the metal alloy defines at least one thermally conductive portion protruding away from the substrate, the metal alloy having a melting temperature of about 160 degrees Celsius or less; and coating at least part of the substrate and at least part of the metal alloy with a thermally conductive coating material having a melting temperate equal to or less than the melting temperature of the low melting metal alloy, wherein the thermally conductive coating material is applied to the at least one thermally conductive portion, whereby the thermally conductive coating material inhibits oxidation of the at least one thermally conductive portion by functioning as a barrier to air and contains migration of the at least thermally conductive portion during operation of the thermal interface material assembly;

wherein the thermally conductive coating material has a thermal conductivity of at least 1 Watt per meter per Kelvin, wherein the at least one thermally conductive portion includes at least one bump protruding away from the substrate, and wherein coupling the metal alloy to the at least one side surface of the substrate includes coupling the metal alloy to the at least one side surface of the same substrate to form multiple bumps along the at least one side surface of the same substrate.

26. The method of claim 25, further comprising arranging the bumps in a pattern along the at least one side surface of the same substrate so that the locations of the bumps generally correspond to locations on an electronic heat generating component away from which heat is to be conducted when the thermal interface material assembly is coupled to the electronic heat generating component.

27. The method of claim 25, further comprising arranging the bumps in a generic pattern along the at least one side surface of the same substrate configured such that the thermal interface material assembly is usable with multiple different electronic heat generating components to effectively conduct heat away from the multiple different electronic heat generating components.

28. A method of making a thermal interface material assembly for use in conducting heat away from an electronic heat generating component, the method comprising:

coupling a metal alloy to at least one side surface of a substrate, wherein the metal alloy defines at least one thermally conductive portion protruding away from the substrate, the metal alloy having a melting temperature of about 160 degrees Celsius or less; and coating at least part of the substrate and at least part of the metal alloy with a thermally conductive coating material having a melting temperate equal to or less than the melting temperature of the low melting metal alloy, wherein the thermally conductive coating material is applied to the at least one thermally conductive portion, whereby the thermally conductive coating material inhibits oxidation of the at least one thermally conductive portion by functioning as a barrier to air and contains migration of the at least thermally conductive portion during operation of the thermal interface material assembly;

wherein:
the substrate comprises a single substrate having first and second oppositely facing sides;
the thermally conductive coating has a melting temperature equal to or less than the melting temperature of the metal alloy, the thermally conductive coating including electrically-conductive fillers; and
coupling a metal alloy to at least one side surface of a substrate comprises coupling the metal alloy to first and second oppositely facing side portions of a single substrate to form multiple bumps along the first side portion and multiple bumps along the second side of the same single substrate.

29. The method of claim 28, wherein coupling the metal alloy to the at least one side surface of the substrate includes soldering the metal alloy to the at least one side surface of the substrate, wherein the thermally conductive coating material has a thermal conductivity of at least 1 Watt per meter per Kelvin.

* * * * *